United States Patent
Jeong

(10) Patent No.: US 8,101,960 B2
(45) Date of Patent: Jan. 24, 2012

(54) NITRIDE LIGHT EMITTING DEVICE AND MANUFACTURING METHOD THEREOF

(75) Inventor: Hwan Hee Jeong, Seoul (KR)

(73) Assignee: LG Innotek, Ltd., Seoul (KR)

( * ) Notice: Subject to any disclaimer, the term of this patent is extended or adjusted under 35 U.S.C. 154(b) by 356 days.

(21) Appl. No.: 11/919,639

(22) PCT Filed: Jul. 31, 2006

(86) PCT No.: PCT/KR2006/003002
§ 371 (c)(1),
(2), (4) Date: Oct. 31, 2007

(87) PCT Pub. No.: WO2007/015612
PCT Pub. Date: Feb. 8, 2007

(65) Prior Publication Data
US 2009/0028202 A1    Jan. 29, 2009

(30) Foreign Application Priority Data
Aug. 1, 2005   (KR) .................. 10-2005-0070225

(51) Int. Cl.
*H01L 33/00* (2010.01)
(52) U.S. Cl. .................. 257/95; 257/99; 257/E33.05
(58) Field of Classification Search .............. 257/95, 257/99, E33.05
See application file for complete search history.

(56) References Cited

U.S. PATENT DOCUMENTS

| | | | |
|---|---|---|---|
| 5,040,044 A * | 8/1991 | Noguchi et al. | 257/103 |
| 5,604,180 A * | 2/1997 | Crews et al. | 504/227 |
| 5,779,924 A * | 7/1998 | Krames et al. | 216/24 |
| 5,789,768 A | 8/1998 | Lee et al. | |
| 5,792,698 A * | 8/1998 | Nishitani | 438/287 |
| 5,898,192 A * | 4/1999 | Gerner | 257/98 |
| 6,277,665 B1 * | 8/2001 | Ma et al. | 438/46 |
| 6,429,460 B1 * | 8/2002 | Chen et al. | 257/79 |
| 6,441,403 B1 * | 8/2002 | Chang et al. | 257/94 |
| 6,469,324 B1 * | 10/2002 | Wang | 257/98 |
| 6,531,405 B1 * | 3/2003 | Wegleiter et al. | 438/745 |
| 6,700,139 B2 * | 3/2004 | Suzuki et al. | 257/103 |
| 6,791,117 B2 * | 9/2004 | Yoshitake et al. | 257/94 |
| 6,825,056 B2 * | 11/2004 | Asakawa et al. | 438/47 |
| 6,884,647 B2 * | 4/2005 | Sakai et al. | 438/30 |
| 6,900,473 B2 * | 5/2005 | Yoshitake et al. | 257/95 |
| 6,921,924 B2 * | 7/2005 | Tsai et al. | 257/95 |
| 7,015,511 B2 * | 3/2006 | Sakai et al. | 257/94 |
| 7,037,738 B2 * | 5/2006 | Sugiyama et al. | 438/29 |
| 7,053,420 B2 * | 5/2006 | Tadatomo et al. | 257/98 |
| 7,071,494 B2 * | 7/2006 | Steigerwald et al. | 257/98 |
| 7,166,870 B2 * | 1/2007 | Erchak et al. | 257/86 |
| 7,186,580 B2 * | 3/2007 | Tran et al. | 438/22 |
| 7,211,834 B2 * | 5/2007 | Sunachi et al. | 257/99 |
| 7,250,635 B2 * | 7/2007 | Lee et al. | 257/98 |

(Continued)

FOREIGN PATENT DOCUMENTS

JP   9-307190 A   11/1997

(Continued)

*Primary Examiner* — David Zarneke

(74) *Attorney, Agent, or Firm* — Birch, Stewart, Kolasch & Birch, LLP

(57) ABSTRACT

A nitride light emitting device includes a first conduction type cladding layer, an active layer, and a second conduction type cladding layer that are stacked on a substrate. The second conduction type cladding layer has an uneven shape including at least one concave and/or convex portion.

18 Claims, 3 Drawing Sheets

U.S. PATENT DOCUMENTS

| | | | |
|---|---|---|---|
| 7,319,247 B2* | 1/2008 | Bader et al. | 257/103 |
| 7,470,938 B2* | 12/2008 | Lee et al. | 257/103 |
| 7,498,607 B2* | 3/2009 | Tsai et al. | 257/94 |
| 7,579,205 B2* | 8/2009 | Ikeda et al. | 438/46 |
| 7,612,380 B2* | 11/2009 | Son | 257/79 |
| 7,663,151 B2* | 2/2010 | Ikeda et al. | 257/95 |
| 7,799,585 B2* | 9/2010 | Erchak et al. | 438/26 |
| 7,804,101 B2* | 9/2010 | Niki et al. | 257/98 |
| 2003/0112866 A1* | 6/2003 | Yu et al. | 375/240.03 |
| 2005/0224816 A1* | 10/2005 | Kim et al. | 257/79 |
| 2006/0261323 A1* | 11/2006 | Suh et al. | 257/13 |
| 2008/0283865 A1* | 11/2008 | Yoo et al. | 257/103 |

FOREIGN PATENT DOCUMENTS

| | | |
|---|---|---|
| JP | 2004-274042 A | 9/2004 |
| KR | 10-0486177 B1 | 5/2005 |

* cited by examiner

NITRIDE LIGHT EMITTING DEVICE AND MANUFACTURING METHOD THEREOF

The present application claims the benefit under 35 U.S.C. §119 of Korean Patent Application No. 10-2005-0070225, filed Aug. 1, 2005, which is hereby incorporated by reference in its entirety.

TECHNICAL FIELD

The present invention relates to a nitride light emitting device and a manufacturing method thereof.

BACKGROUND ART

In general, light emitting diodes are semiconductor devices formed of a compound such as GaAs, AlGaAs, GaN, InGaN, AlGaInP, etc., and are being widely used as various types of light sources for optical communications and electronic devices.

One of the most critical factors that determine characteristics of the light emitting diode is the intensity of light. Therefore, there have been many attempts to improve brightness of the light emitting diode through various design changes.

For example, the brightness of the light emitting diode could be improved by forming one or more quantum wells in an active layer generating light using recombination of electrons and holes. Also, there was an attempt to improve brightness of the light emitting diode by controlling the numbers or thickness of the quantum wells or barrier layers.

However, such related art studies are only about maximizing light generated from the active layer itself. However, such a method of improving the brightness of light by changing a structure of the active layer itself is disadvantageous in that designs become complicated depending on materials, and it is difficult to apply the method to actual processes.

A nitride light emitting device according to the related art includes a first conduction type cladding layer (not shown), an active layer (not shown), and a second conduction type cladding layer (not shown).

According to the related art, the second conduction type cladding layer should have a thickness of about 150 nm or more. That is, the layer should be grown to 150 nm or more because a thin layer fails to obtain desired characteristics of the second conduction type cladding layer.

However, the related art has the following problems. First, light loss becomes severe as a thickness of the second cladding layer gets greater, because light generated from a light emitting layer passes through the second cladding layer having a thickness of 150 nm and then is emitted to the outside.

Also, since a length of a current path in a vertical direction increases as the thickness increases, resistance occurs as much, which does not help the light emitting layer and thus causes energy to be wasted.

DISCLOSURE

Technical Problem

The present invention provides a nitride light emitting device that can achieve high light emission efficiency by reducing light loss due to resistance in vertical and horizontal directions, and a manufacturing method thereof.

Technical Solution

A nitride light emitting device includes a first conduction type cladding layer, an active layer, and a second conduction type cladding layer that are stacked on a substrate, wherein the second conduction type cladding layer has an uneven shape including at least one concave and/or convex portion.

A method of manufacturing a nitride light emitting device including a first conduction type cladding layer, an active layer, and a second conduction type cladding layer that are stacked on a substrate, includes etching and patterning the second conduction type cladding layer; and forming a transparent electrode on the patterned second conduction type cladding layer.

Advantageous Effects

As described above, in a nitride light emitting device according to the embodiment of the present invention, a second conduction type cladding layer is etched and patterned and an etched portion thereof is filled with a transparent electrode having better conductivity than that of the second conduction type cladding layer. Thus, improved current characteristics are obtained in vertical and horizontal direction, so that light loss due to resistance can be reduced.

According to the embodiment of the present invention, since the second conduction type cladding layer is formed of a transparent material having high transmittance with respect to light, external quantum efficiency can be also improved.

MODE FOR INVENTION

A nitride light emitting device and a manufacturing method according to the embodiment of the present invention will be described with reference to accompanying drawings.

In the Description, the term, 'on' represents that an element is contacted directly or indirectly to another element.

First Embodiment

Figure 1:
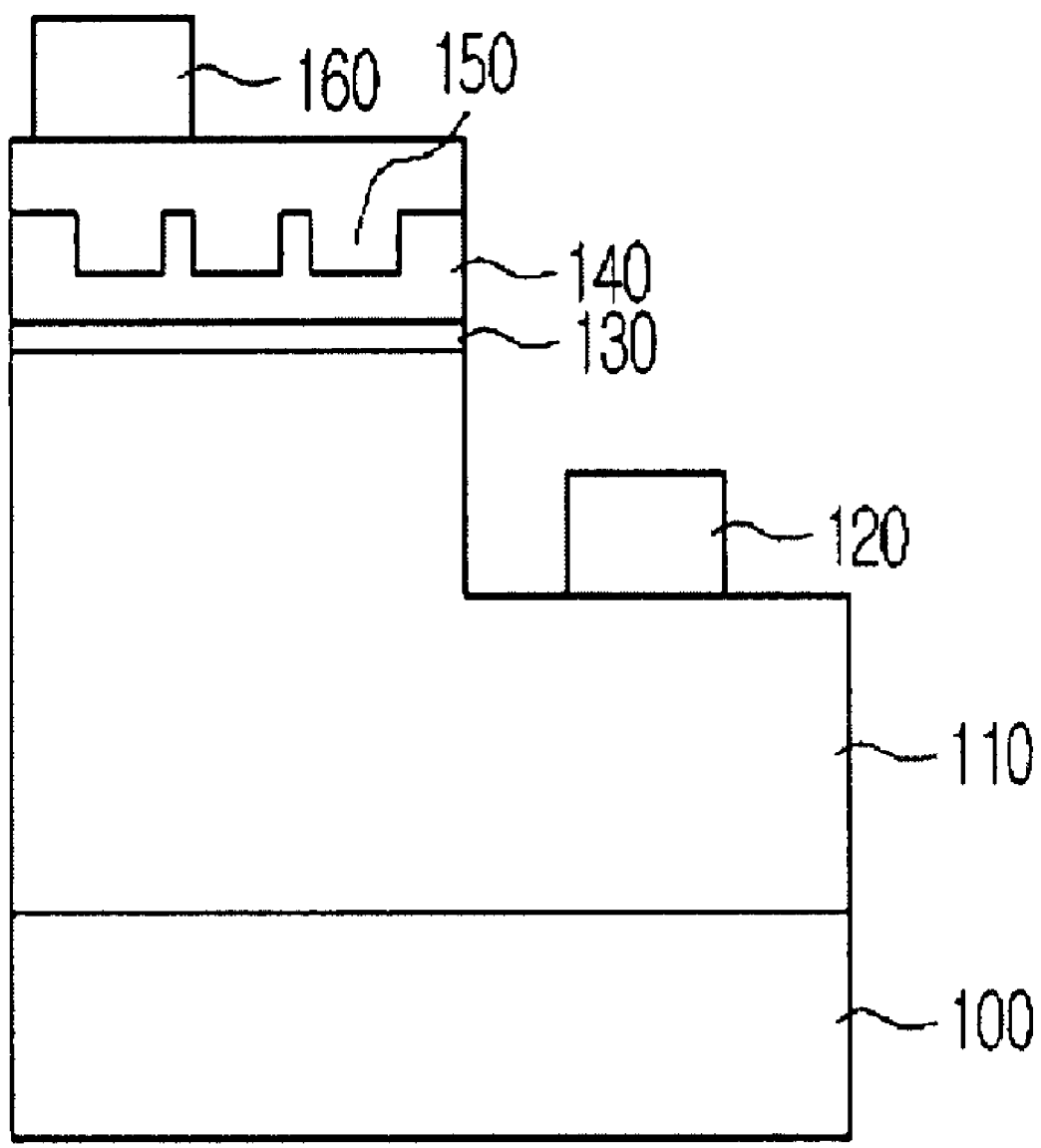
FIG. 1 is a cross-sectional view of a nitride light emitting device according to a first embodiment of the present invention.

FIG. 1 is a cross-sectional view of a nitride light emitting device according to the first embodiment of the present invention.

As illustrated in FIG. 1, the nitride light emitting device according to the embodiment of the present invention includes a substrate 100, a first conduction type cladding layer 110 formed on the substrate 100, an active layer 130 formed on the first conduction type cladding layer 110, and a second conduction type cladding layer 140 formed on the active layer 130.

The nitride light emitting device according to the embodiment of the present invention may further include a first electrode 120 formed on the first conduction type cladding layer 110, and a second electrode 160 formed on the second conduction type cladding layer 140. The first electrode 120 can be an n-type electrode, and the second electrode 160 can be a p-type electrode. Also, the first electrode 120 can be a p-type electrode, and the second electrode 160 can be an n-type electrode.

The first conduction type cladding layer 110, the second conduction type cladding layer 140, and the active layer 130 may be formed of a semiconductor material belonging to groups III-V such as GaN.

As the substrate 100, a sapphire ($Al_2O_3$), Si, SiC or GaN substrate may be used.

The first electrode 120 can be formed on a top surface of the first conduction type cladding layer 110 exposed by removing parts of the active layer 130 and the second conduction type cladding layer 140 both of which have been grown. The first conduction type cladding layer 110 can be electrically connected to the first electrode 120.

The second conduction type cladding layer 140 can be electrically connected to the second electrode 160.

When a voltage is applied to the first electrode 120 and the second electrode 160, electrons are injected to the active layer 130 from the first conduction type cladding layer 110, and holes are injected to the active layer 130 from the second conduction type cladding layer 140.

The electrons and holes injected to the active layer 130 region are recombined and generate light.

the embodiment of the present invention is characterized in that the second conduction type cladding layer 140 is etched and patterned to have an uneven shape, and a transparent electrode 150 is formed on the second conduction type cladding layer 140 including an etched portion.

The second conduction type cladding layer 140 may have at least one concave and/or convex portion.

The transparent electrode 150 may be formed of a metal oxide such as ITO, IZO (In—ZnO), GZO (Ga—ZnO), AZO (Al—ZnO), AGZnO (Al—Ga ZnO), IGZO (In—Ga ZnO), IrOx and the like.

Light generated from the active layer 130 passes through the second conduction type cladding layer 140 and then is emitted to the outside. Therefore, the second cladding layer 140 is etched and patterned to have an uneven shape, and an etched portion thereof is filled with the transparent electrode 150.

A distance that light from the active layer 130 travels through the second conduction type cladding layer 140 can be reduced by filling of the etched portion with the transparent electrode 150. Accordingly, higher light efficiency can be obtained.

Thus, unlike the related art, although the second conduction type cladding layer 140 has a thickness of less than 150 nm, high light efficiency may be obtained.

Also, since the transparent electrode 150 has better conductivity than that of the second conduction type cladding layer 140, current spreading is also improved.

In the first embodiment of the present invention, the second conduction type cladding layer 140, and the first conduction type cladding layer 110 can be formed as a p-type cladding layer and an n-type cladding layer, respectively, so that a nitride light emitting device having a pn junction structure may be formed.

Second Embodiment

Figure 2:
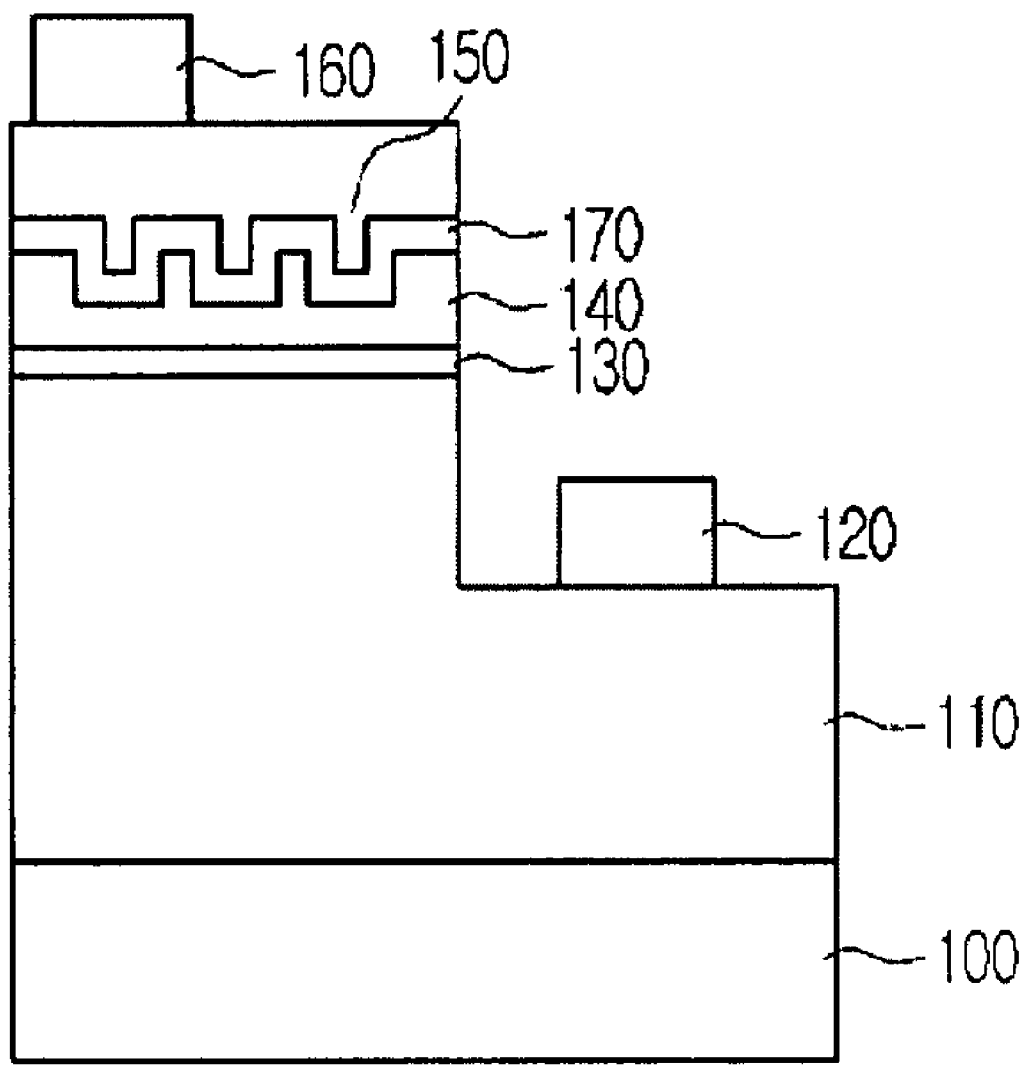
FIG. 2 is a cross-sectional view of a nitride light emitting device according to a second embodiment of the present invention.

FIG. 2 is a cross-sectional view of a nitride light emitting device according to the second embodiment of the present invention.

The second embodiment of the present invention is an example of a nitride light emitting device having an npn junction structure.

As illustrated in FIG. 2, the nitride light emitting device according to the second embodiment of the present invention includes a substrate 100, a first conduction type cladding layer 110, a first electrode 120, an active layer 130, a second conduction type cladding layer 140, a third conduction type cladding layer 170, a transparent electrode 150, and a second electrode 160.

The nitride light emitting device according to the second embodiment of the present invention is different from that of the first embodiment in that a third conduction type cladding layer 170 is further formed between the second conduction type cladding layer 140 and the transparent layer 150.

The third conduction type cladding layer 170 is formed as an n-type cladding layer, and may be formed on the second conduction type cladding layer 140 patterned to have an uneven shape.

The transparent electrode 150 is formed on the third conduction type cladding layer 170.

A top surface of the third conduction type cladding layer 170 has an uneven shape corresponding to the uneven shape of the second conduction type cladding layer 140. An uneven portion of the third conduction type cladding layer 170 is filled with the transparent electrode 150.

The nitride light emitting device having such a stack structure has an npn junction structure since the first conduction type cladding layer 110 and the third conduction type cladding layer 170 are formed as n-type cladding layers, and the second conduction type cladding layer 140 is formed as a p-type cladding layer.

As illustrated in FIG. 2, the nitride light emitting device according to the second embodiment of the present invention includes the third conduction type cladding layer 170 with an uneven top surface.

Also, the nitride light emitting device according to the second embodiment of the present invention may employ characteristics of corresponding components of the first embodiment.

Third Embodiment

Figure 3:
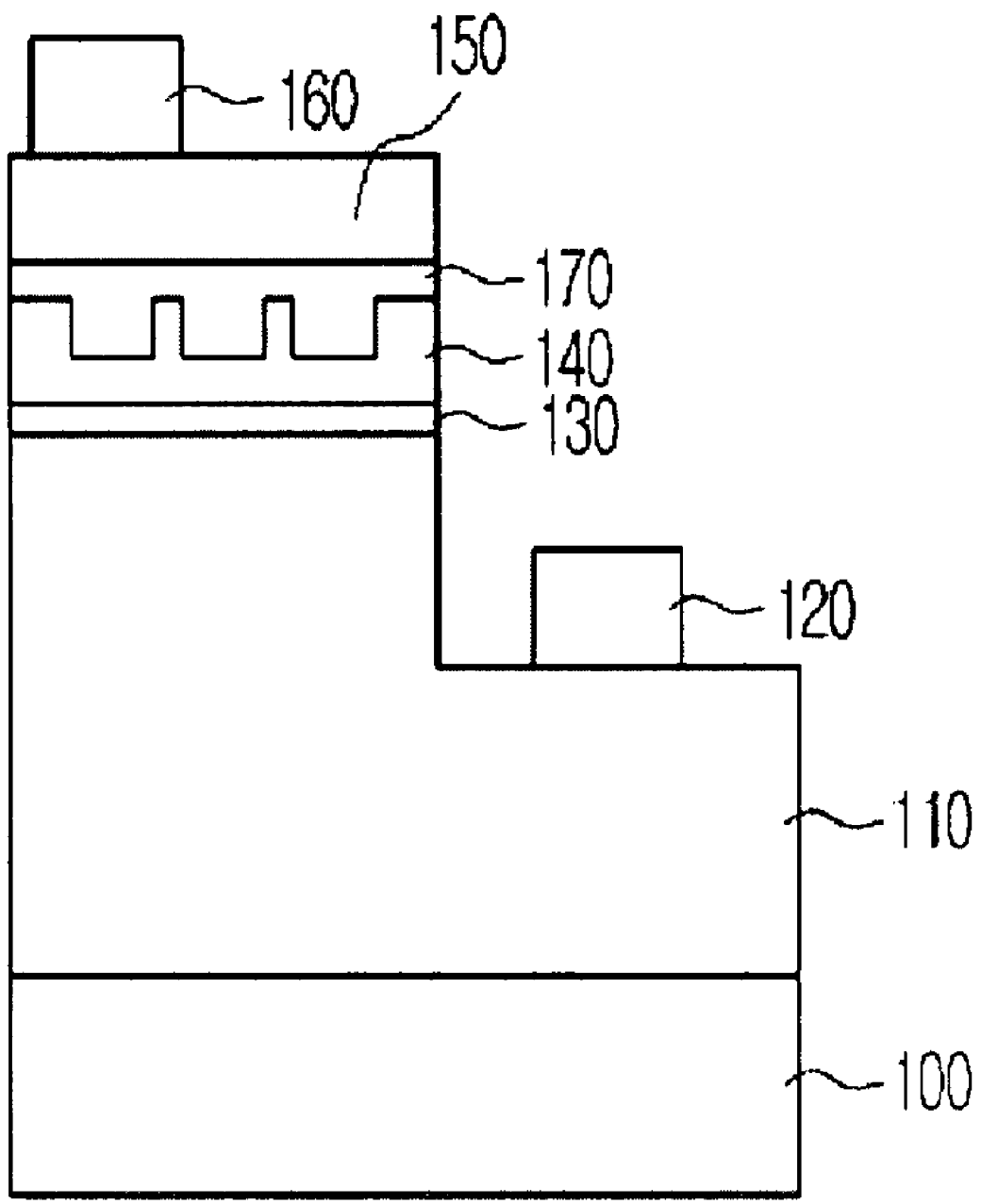
FIG. 3 is a cross-sectional view of a nitride light emitting device according to a third embodiment of the present invention.

FIG. 3 is a cross-sectional view of a nitride light emitting device according to the third embodiment of the present invention.

The third embodiment of the present invention is an example of a nitride light emitting device having an npn junction structure.

As illustrated in FIG. 3, the nitride light emitting device according to the third embodiment of the present invention may include a substrate 100, a first conduction type cladding layer 110, a first electrode 120, an active layer 130, a second conduction type cladding layer 140, a third conduction type cladding layer 170, a transparent electrode 150, and a second electrode 160.

The nitride light emitting device according to the third embodiment of the present invention is different from that of the second embodiment in that a top surface of the third conduction type cladding layer 170 is formed flat.

INDUSTRIAL APPLICABILITY

As described above, the embodiment of the present invention may be applied to various kinds of nitride light emitting device, for example, a nitride light emitting diode and the like, to reduce light loss due to resistance in vertical and horizontal directions. Accordingly, a nitride light emitting device having high light emission efficiency, and a manufacturing method thereof can be provided.

Also, according to the embodiment of the present invention, a nitride light emitting device having an np junction structure, an npn junction structure, or a pnp junction structure can be formed by controlling conductivity of each cladding layer.

It will be apparent to those skilled in the art that various modifications and variations can be made in the embodiment of the present invention. Thus, it is intended that the embodiment of the present invention covers the modifications and variations of this invention provided they come with the scope of the appended claims and their equivalents.

The invention claimed is:

1. A nitride light emitting device, comprising:
    a light emitting structure including a first conduction type cladding layer, an active layer, and a second conduction type cladding layer;
    a transparent electrode on the second conduction type cladding layer; and
    an electrode on the transparent electrode,
    wherein the second conduction type cladding layer has a pattern including at least one recess portion and at least one protrusion portion,
    wherein a lower side of the at least one recess portion is closer to the active layer than to a bottom side of the electrode,
    wherein the transparent electrode comprises a second pattern corresponding to the pattern of the second conduction type cladding layer,
    wherein the transparent electrode comprises a substantially flat top surface,
    wherein the transparent electrode is directly disposed on the at least one recess portion of the second conduction type cladding layer,
    wherein the substantially flat top surface of the transparent electrode is higher than a top surface of the pattern of the second conduction type cladding layer, and
    wherein the second conduction type cladding layer has a thickness of less than 150 nm.

2. The nitride light emitting device according to claim 1, comprising a third conduction type cladding layer formed on the second conduction type cladding layer.

3. The nitride light emitting device according to claim 2, wherein the first conduction type cladding layer and the third conduction type cladding layer are n-type cladding layers, and the second conduction type cladding layer is a p-type cladding layer.

4. The nitride light emitting device according to claim 2, wherein the third conduction type cladding layer has an upper surface formed in an uneven shape.

5. The nitride light emitting device according to claim 2, wherein the third conduction type cladding layer has a flat upper surface.

6. The nitride light emitting device according to claim 1, wherein the transparent electrode is formed of a metal oxide.

7. The nitride light emitting device according to claim 1, wherein the transparent electrode is formed of at least one material selected from the group consisting of ITO, IZO (In—ZnO), GZO (Ga—ZnO), AZO (Al—ZnO), AGZnO (Al—Ga ZnO), IGZO (In-Gz ZnO), and IrOx.

8. The nitride light emitting device according to claim 1, wherein the transparent electrode has a conductivity higher than a conductivity of the second conduction type cladding layer.

9. The nitride light emitting device according to claim 2, wherein the transparent electrode is on the third conduction type cladding layer.

10. The nitride light emitting device according to claim 1, further comprising a substrate under the light emitting structure.

11. The nitride light emitting device according to claim 1, wherein the transparent electrode is on the pattern.

12. The nitride light emitting device according to claim 1, wherein the transparent electrode fills with the pattern.

13. The nitride light emitting device according to claim 1, wherein the pattern is in the second conduction type cladding layer.

14. The nitride light emitting device according to claim 1, wherein the at least one recess portion includes plural recess portions and the at least one protrusion portion includes plural protrusion portions, and
    wherein a lower side of a majority of the plural recess portions is closer to the active layer than to the bottom side of the electrode.

15. The nitride light emitting device according to claim 1, wherein a top surface of the lighting emitting structure is substantially planar.

16. The nitride light emitting device according to claim 1, wherein the transparent electrode is between the electrode and the second conduction type cladding layer.

17. The nitride light emitting device according to claim 1, wherein a cross section of the pattern has a polygon shape.

18. The nitride light emitting device according to claim 1, wherein the at least one recess portion includes at least one concave portion and the at least one protrusion portion includes at least one convex portion.

* * * * *